(12) United States Patent
Nagata et al.

(10) Patent No.: US 6,703,256 B2
(45) Date of Patent: Mar. 9, 2004

(54) SOLID-STATE IMAGE SENSOR AND METHOD OF FABRICATING THE SAME

(75) Inventors: Tsuyoshi Nagata, Tokyo (JP); Yasutaka Nakashiba, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 12 days.

(21) Appl. No.: 09/968,880

(22) Filed: Oct. 3, 2001

(65) Prior Publication Data

US 2002/0009823 A1 Jan. 24, 2002

Related U.S. Application Data

(62) Division of application No. 09/382,643, filed on Aug. 25, 1999, now Pat. No. 6,326,653.

(30) Foreign Application Priority Data

Aug. 27, 1998 (JP) ............................................. 10-241322

(51) Int. Cl.[7] ........................ H01L 21/00; H01L 21/336; H01L 21/331

(52) U.S. Cl. ............................. 438/48; 438/69; 438/70; 438/300; 438/309

(58) Field of Search ............................. 438/48, 69, 70, 438/300, 309

(56) References Cited

U.S. PATENT DOCUMENTS

| | | | | |
|---|---|---|---|---|
| 4,679,068 A | * | 7/1987 | Lillquist et al. | 348/33 |
| 5,202,282 A | * | 4/1993 | Son | 438/60 |
| 5,976,908 A | * | 11/1999 | Kwon et al. | 438/69 |
| 6,137,127 A | * | 10/2000 | Merrill | 257/292 |

FOREIGN PATENT DOCUMENTS

| | | |
|---|---|---|
| JP | 4-354161 | 12/1992 |
| JP | 7-326726 | 12/1995 |
| JP | 8-78651 | 3/1996 |
| JP | 97-5728 | 4/1997 |

* cited by examiner

*Primary Examiner*—Matthew Smith
*Assistant Examiner*—Chuong A Luu
(74) *Attorney, Agent, or Firm*—Sughrue Mion, PLLC

(57) ABSTRACT

There is provided a solid-state image sensor including a first region in which light is converted into electricity, and a second region composed of silicide. The second region at least partially forms a boarder area of the first region at a surface of the first region. The solid-state image sensor prevents occurrence of smear.

16 Claims, 6 Drawing Sheets

SOLID-STATE IMAGE SENSOR AND METHOD OF FABRICATING THE SAME

This is a divisional of application Ser. No. 09/382,643 filed Aug. 25, 1999, now U.S. Pat. No. 6,326,653, the disclosure of which is incorporated herein by reference.

BACKGROUND OF THE INVENTION

1. Field of the Invention

The invention relates to a solid-state image sensor and a method of fabricating the same, and more particularly to a solid-state image sensor capable of preventing occurrence of smear, and a method of fabricating the same.

2. Description of the Related Art

FIG. 1 illustrates a unit cell of a CMOS sensor which is an active XY address type solid-state image sensor.

The illustrated unit cell is comprised of a p-type silicon substrate 10, a p-type well 12 formed in the p-type silicon substrate 10, an n-type region 14 formed in the p-type well 12 and acting as a photodiode, a gate insulating film 16 formed on a surface of the p-type silicon substrate 10 and composed of silicon dioxide ($SiO_2$), a reset gate 18 formed on the gate insulating film 16 and composed of polysilicon, a reset drain region 20 composed of an $n^+$ type region, a field oxide film 21 for electrical isolation between regions in each of which a device is to be fabricated, and a light-impermeable film 22 composed of metal and having an opening 23 through which light enters the n-type region 14.

An interlayer insulating film and a wiring layer are formed between the light-impermeable film 22 and the n-type region 14 in which light is converted into electricity.

The n-type region 14 is electrically connected to a source follower amplifier 24. As illustrated in FIG. 1, the source follower amplifier 24 is comprised of (a) a first MOS transistor 26 acting as a selector switch, (b) a second MOS transistor 28 having a source electrically connected to a drain of the first MOS transistor 26, a source electrically connected to a voltage Vdd, and a gate electrically connected to the n-type region 14, (c) a third MOS transistor 29 acting as a load, and having a drain electrically connected to a source of the first MOS transistor 26, and a source electrically connected to a voltage Vss, and (d) an output terminal 30 electrically connected to a source of the first MOS transistor 26 and a drain of the third MOS transistor 29.

The CMOS sensor illustrated in FIG. 1 operates as follows.

First, a high pulse $\Phi_R$ is applied to the reset gate 18 to thereby cause the n-type region 14 acting as a photodiode, to have a certain potential. Then, a low pulse $\Phi_R$ is applied to the reset gate 18 to thereby accumulate electric charges in a depletion layer which electric charges have been generated by converting light into electricity.

A potential of the photodiode 14 varies in accordance with the thus accumulated electric charges. Variation in the potential is output through the output terminal 30 of the source follower amplifier 24.

In such a conventional CMOS sensor as illustrated in FIG. 1, since an interlayer insulating film and a plurality of wiring layers are sandwiched between the light-impermeable film 22 and the n-type region or light-electricity converting region 14, the light-impermeable film 22 is much spaced away from the n-type region 14. Hence, light 25 diffracted due to diffraction effect of light having passed through the opening 23 reaches a border area of the light-electricity converting region 14, as illustrated in FIG. 1.

Thus, the conventional CMOS sensor is accompanied with a problem of so-called smear that light reaching a border of the light-electricity converting region or n-type region 14 due to diffraction effect is converted into electricity to thereby generate a false signal.

In addition, the thus generated false signal is trapped in adjacent light-electricity converting regions or in a diffusion layer of the source follower amplifier 24, resulting in another problem that a S/N ratio of image signals is degraded.

SUMMARY OF THE INVENTION

In view of the above-mentioned problem, it is an object of the present invention to provide a solid-state image sensor which is capable of preventing generation of smear or the above-mentioned false signal. It is also an object of the present invention to provide a method of fabricating such a solid-state image sensor.

In one aspect of the present invention, there is provided a solid-state image sensor including a first region in which light is converted into electricity, and a second region composed of silicide, the second region at least partially forming a border area of the first region at a surface of the first region.

The second region can interrupt light which would cause smear, from entering the region.

It is preferable that the solid-state image sensor is constituted as a CMOS sensor or a CCD sensor.

It is preferable that the second region is composed of silicide of refractory metal.

There is further provided a solid-state image sensor including a first region in which light is converted into electricity, a reset gate electrode, a reset drain region, and a second region composed of suicide, the second region at least partially forming a border area of the first region at a surface of the first region.

There is still further provided a solid-state image sensor including a first region in which light is converted into electricity, a reset gate electrode, a reset drain region, a second region composed of suicide, the second region at least partially forming a border area of the first region at a surface of the first region, and a third region composed of suicide, the third region covering a surface of the reset drain region therewith.

It is preferable that the second and third regions are formed from a common layer.

There is yet further provided a solid-state image sensor including a first region in which light is converted into electricity, a light-impermeable film having an opening situated above the first region, and a second region composed of silicide, the second region at least partially forming a border area of the first region at a surface of the first region such that the second region interrupts diffracted light coming through the opening, from entering the first region.

There is still yet further provided a solid-state image sensor including a first region in which light is converted into electricity, a light-impermeable film having an opening situated above the first region, a reset gate electrode, a reset drain region, and a second region composed of silicide, the second region at least partially forming a border area of the first region at a surface of the first region such that the second region interrupts diffracted light coming through the opening, from entering the first region.

There is further provided a solid-state image sensor including a first region in which light is converted into electricity, a light-impermeable film having an opening situated above the first region, a reset gate electrode, a reset drain region, a second region composed of silicide, the second region at least partially forming a border area of the first region at a surface of the first region such that the second region interrupts diffracted light coming through the opening, from entering the first region, and a third region composed of silicide, the third region covering a surface of the reset drain region therewith.

In another aspect of the present invention, there is provided a method of fabricating a solid-state image sensor, including the steps of (a) forming a first region in which light is converted into electricity, in a silicon substrate, the first region having an electrical conductivity opposite to an electrical conductivity of the silicon substrate, and (b) forming a second region composed of silicide, the second region forming a border area of the first region at a surface of the first region.

For instance, the step (b) may be carried out by silicifying a border area of the first region or deposition a refractory metal film and heating the refractory metal film.

It is preferable that the method further includes the step of forming a light-impermeable film having an opening situated above the first region.

There is further provided a method of fabricating a solid-state image sensor, including the steps of (a) forming a first region in which light is converted into electricity, in a silicon substrate, the first region having an electrical conductivity opposite to an electrical conductivity of the silicon substrate, (b) forming a reset gate on the silicon substrate, (c) forming a reset drain region in the silicon substrate, the reset drain region having an electrical conductivity opposite to an electrical conductivity of the silicon substrate, and (d) forming a second region composed of suicide, the second region forming a border area of the first region at a surface of the first region.

It is preferable that the method further includes the step of forming a third region on a surface of the reset drain region, the third region being composed of silicide, in which case, it is preferable that the second and third regions are simultaneously formed.

There is still further provided a method of fabricating a solid-state image sensor, including the steps of (a) forming a well in a silicon substrate, (b) forming a first region in which light is converted into electricity, in the well, the first region having an electrical conductivity opposite to an electrical conductivity of the well, (c) forming a reset gate on the well, (d) forming a reset drain region in the well, the reset drain region having an electrical conductivity opposite to an electrical conductivity of the well, and (e) forming a second region composed of silicide, the second region forming a border area of the first region at a surface of the first region.

The advantages obtained by the aforementioned present invention will be described hereinbelow.

In the solid-state image sensor in accordance with the present invention, the second region of silicified region is formed at a border of the first region or light-electricity converting region. As a result, there is no space into which diffracted light which would cause smear is incident. Hence, light which would cause smear is prevented form entering the first region or light-electricity converting region.

Accordingly, it is now possible to prevent generation of a false signal to be generated by light entering a border area of the first region due to diffraction effect. In addition, it is also possible to prevent the thus generated false signal from being trapped in adjacent light-electricity converting regions or in a diffusion layer of a source follower amplifier, and thus, possible to prevent a S/N ratio of image signals from being degraded.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 2:
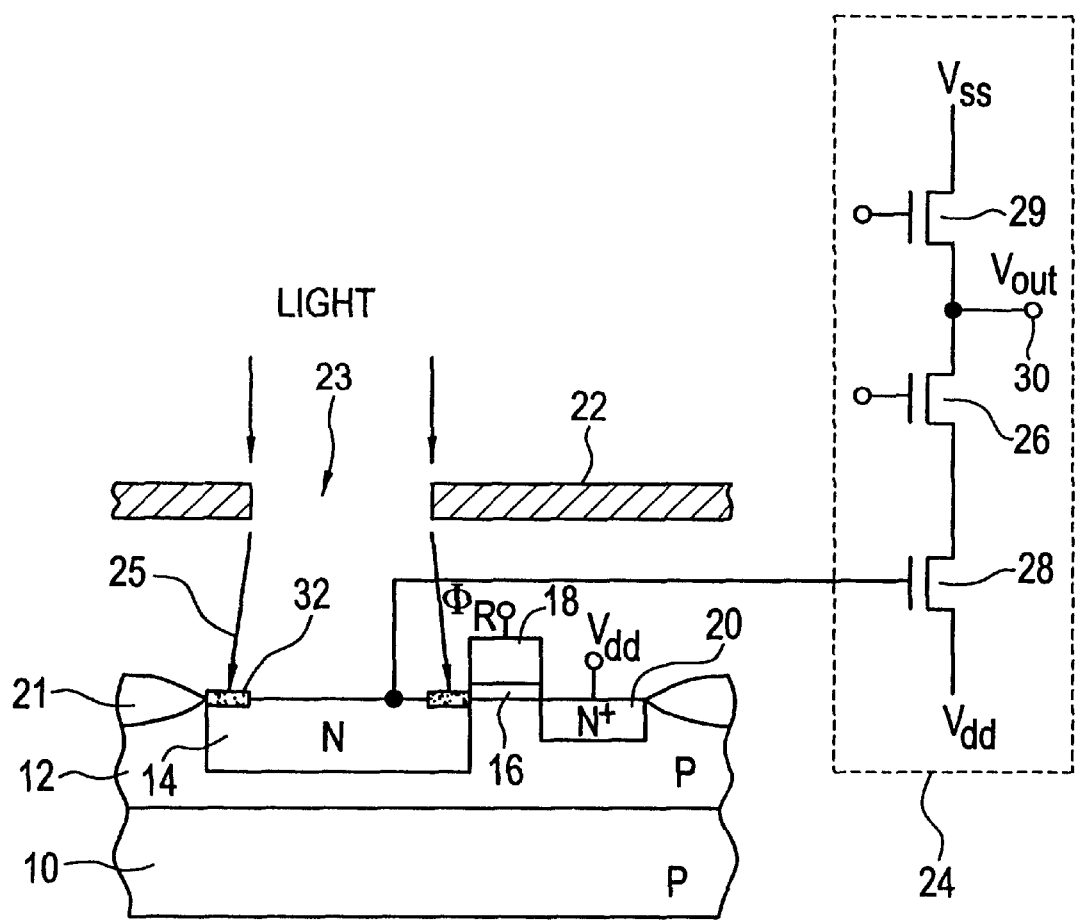
FIG. 2 is a cross-sectional view of a unit cell of a CMOS sensor in accordance with the first embodiment of the present invention.

FIG. 2 illustrates a unit cell of a CMOS sensor in accordance with the first embodiment of the present invention.

The illustrated unit cell is comprised of a p-type silicon substrate 10, a p-type well 12 formed in the p-type silicon substrate 10, an n-type region or light-electricity converting region 14 formed in the p-type well 12 and acting as a photodiode, a second region 32 composed of silicide and formed on a border of the n-type region 14 at a surface of the n-type region 14, a gate insulating film 16 formed on a surface of the p-type silicon substrate 10 and composed of silicon dioxide ($SiC_2$), a reset gate 18 formed on the gate insulating film 16 and composed of polysilicon, a reset drain region 20 composed of an $n^+$ type region, a field oxide film 21 for electrical isolation between regions in each of which a device is to be fabricated, and a light-impermeable film 22 composed of metal and having an opening 23 through which light enters the n-type region 14.

Figure 1:
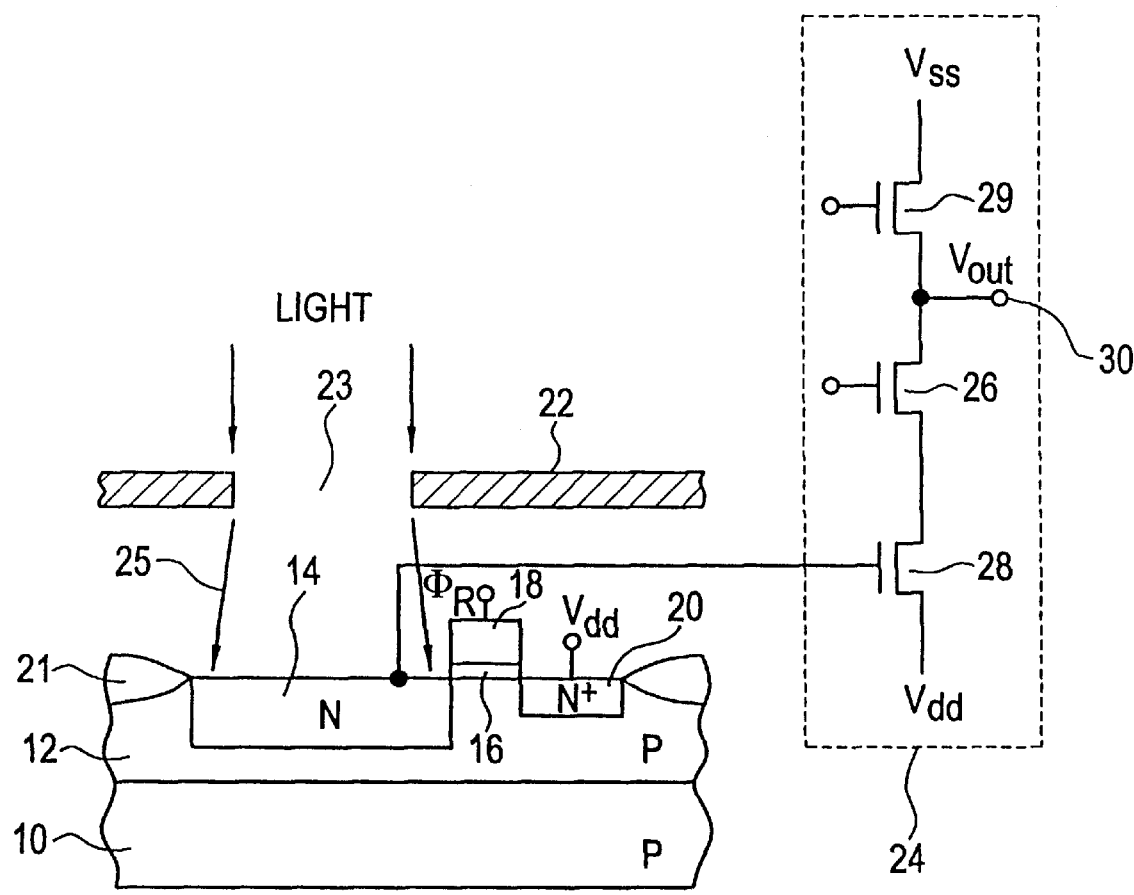
FIG. 1 is a cross-sectional view of a unit cell of a conventional CMOS sensor which is an active XY address type solid-state image sensor.

The unit cell in accordance with the first embodiment is structurally different from the convention al unit cell illustrated in FIG. 1 in that the unit cell in accordance with the first embodiment is provided with the second region 32 composed of silicide. The second region 32 may be formed, for instance, by silicifying the n-type region 14 at a border thereof.

An interlayer insulating film and a wiring layer are formed between the light-impermeable film 22 and the n-type region 14 in which light is converted into electricity.

The n-type region 14 is electrically connected to a source follower amplifier 24. As illustrated in FIG. 1, the source follower amplifier 24 is comprised of (a) a first MOS transistor 26 acting as a selector switch, (b) a second MOS transistor 28 having a source electrically connected to a drain of the first MOS transistor 26, a source electrically connected to a voltage Vdd, and a gate electrically connected to the n-type region 14, (c) a third MOS transistor 29 acting as a load, and having a drain electrically connected to a source of the first MOS transistor 26, and a source electrically connected to a voltage Vss, and (d) an output terminal 30 electrically connected to a source of the first MOS transistor 26 and a drain of the third MOS transistor 29.

In accordance with the CMOS sensor, since the second region or suicide region 32 is formed at a border of the n-type region or light-electricity region 14, there is no angle between the light-impermeable film 22 and the n-type region 14 for light which would cause smear, to enter the n-type region 14 due to diffraction. Accordingly, it is possible to prevent light which would cause smear, from entering the n-type region or light-electricity converting region 14.

A method of fabricating the unit cell illustrated in FIG. 2 is explained hereinbelow with reference to FIGS. 3A to 3F.

Figure 3A:
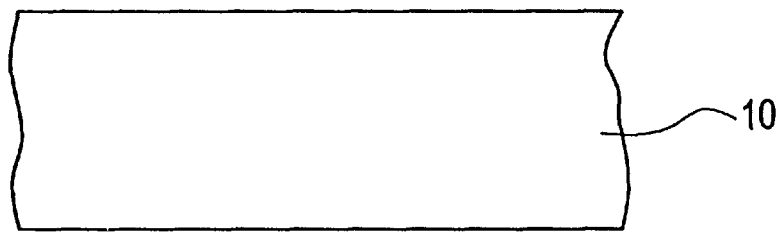
FIGS. 3A to 3F are cross-sectional views of a unit cell, illustrating respective steps of a method of fabricating the unit cell illustrated in FIG. 2.

First, as illustrated in FIG. 3A, there is prepared a p-type silicon substrate 10.

Figure 3B:
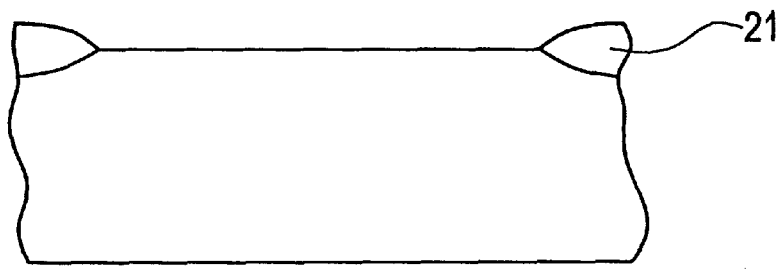

Then, as illustrated in FIG. 3B, field oxide films 21 are formed at a surface of the p-type silicon substrate 10 for electrical isolation among regions in each of which a device is to be fabricated. The adjacent field oxide films 21 are spaced away from each other by about 0.6 $\mu$m.

Figure 3C:
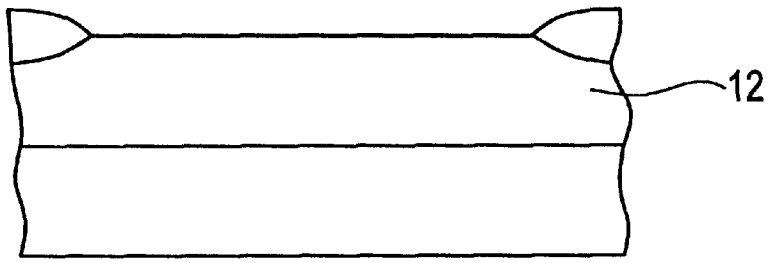

Then, as illustrated in FIG. 3C, boron (B) is ion-implanted into the p-type silicon substrate 10 to thereby form a p-type well 12 in the p-type silicon substrate 10. For instance, the p-type silicon substrate 10 is implanted successively three times at 300 keV with doses of $1 \times 10^{13}$ boron cm$^{-2}$, at 100 keV with doses of $5 \times 10^{12}$ boron cm$^{-2}$ and at 60 keV with doses of $2.5 \times 10^{12}$ boron cm$^{-2}$. The step of ion-implantation into the p-type silicon substrate 10 for forming the p-type well 12 may be omitted, if the p-type silicon substrate 10 had sufficient impurity concentration without ion-implantation.

Figure 3D:
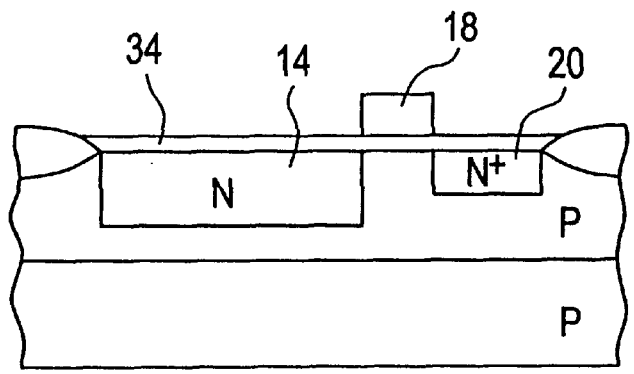

Then, as illustrated in FIG. 3D, a silicon dioxide film 34 having a thickness of about 10 nm is formed on a surface of the p-type silicon substrate 10, and thereafter, a reset gate 18 is formed on the silicon dioxide film 34. The reset gate 18 may be formed of polysilicon or polycide having a two-layered structure comprising a polysilicon layer and a tungsten silicide layer.

Then, the p-type silicon substrate 10 is implanted at 70 keV with doses of $1 \times 10^{16}$ arsenic (As) cm$^{-2}$ to thereby form a reset drain region 20 in the p-type well 12. The reset drain region 20 is formed of an n$^+$ type region.

Then, the reset drain region 20 is covered with a resist film, and thereafter, the p-type silicon substrate 10 is implanted at 150 keV with doses of $1 \times 10^{13}$ phosphorus (P) cm$^{-2}$ to thereby form a light-electricity converting region or n-type region 14.

Figure 3E:
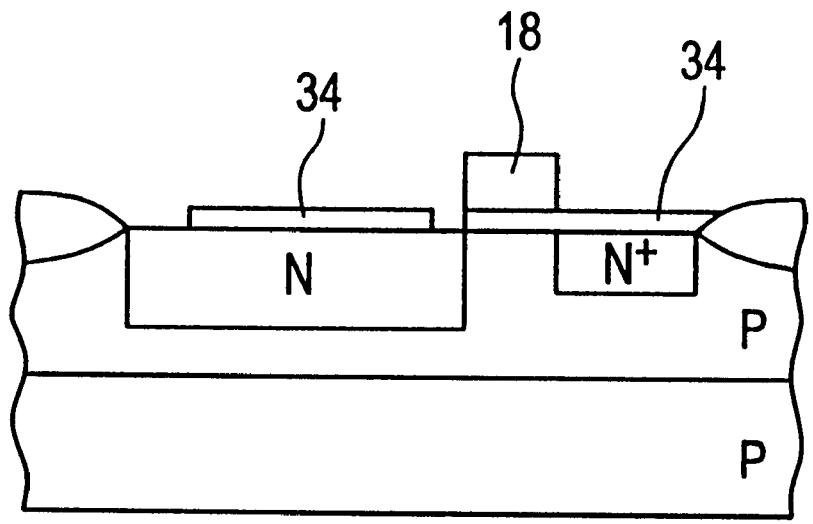

Then, as illustrated in FIG. 3E, the silicon dioxide film 34 is partially removed in an area where the light-electricity converting region 14 is to be silicified at a surface. That is, the silicon dioxide film 34 is removed at border of the light-electricity converting region 14.

In the first embodiment, the silicon dioxide film 34 is formed also as a gate insulating film 16. As an alternative, the silicon dioxide film 34 may be removed except a portion situated below the reset gate 18 after formation of the reset gate 18, and a silicon dioxide film may be newly formed on the light-electricity converting region 14 by a thickness of about 50 nm.

Figure 3F:
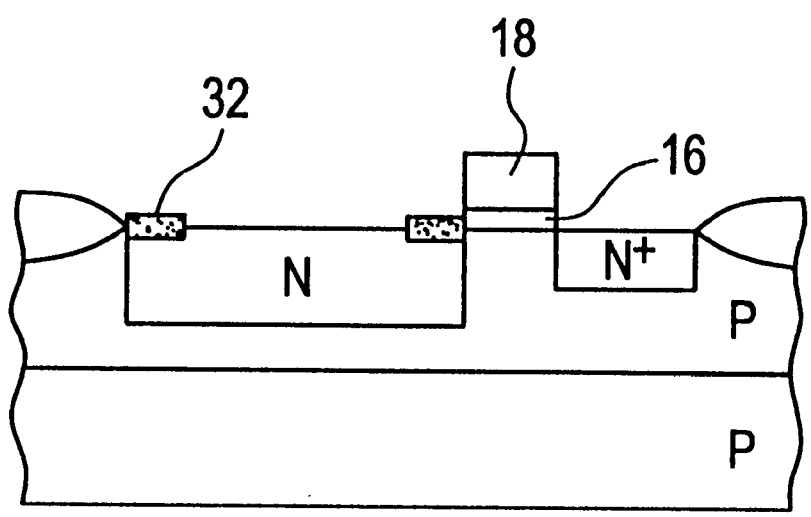

Then, as illustrated in FIG. 3F, titanium (Ti) is deposited by sputtering by a thickness of about 40 nm on the light-electricity converting region 14 at a region where the silicon dioxide film 34 was removed. Thereafter, titanium is heated at 700 degrees centigrade for a minute to thereby form a silicide region 32.

Then, the silicon dioxide film 34 is entirely removed. A portion of the silicon dioxide film 34, situated below the reset gate 18, makes the gate insulating film 16.

In the first embodiment, the silicide region 32 is composed of titanium silicide. However, it should be noted that silicide of which the silicide region 32 is composed is not to be limited to titanium silicide. For instance, the silicide region 32 may be composed of silicide of refractory metal such as molybdenum (Mo), tungsten (W) and cobalt (Co).

Then, there are formed an interlayer insulating film, a wiring layer, a light-impermeable film, and so on. Thus, there is completed the unit cell illustrated in FIG. 2.

Figure 4:
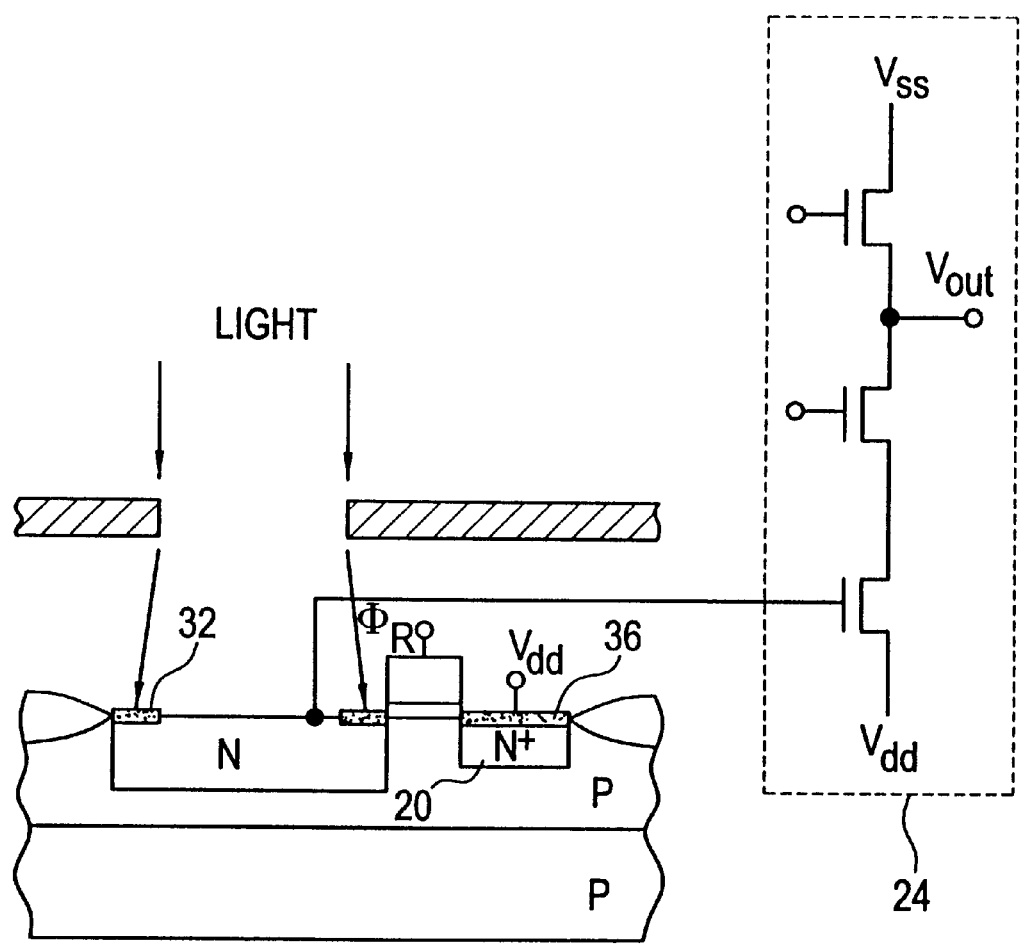
FIG. 4 is a cross-sectional view of a unit cell of a CMOS sensor in accordance with the second embodiment of the present invention.

FIG. 4 illustrates a unit cell of a CMOS sensor in accordance with the second embodiment of the present invention.

In the first embodiment, the silicide region 32 is formed only at a border of the light-electricity converting region 14. However, it should bee noted that a silicide layer may be formed concurrently with the suicide region 32 on the reset drain region 20 as a low-resistive electrode.

In the second embodiment, a silicide layer 36 is formed also on the reset drain region 20. The unit cell in accordance with the second embodiment, illustrated in FIG. 4, is structurally different from the unit cell in accordance with the first embodiment, illustrated in FIG. 2, only in that the silicide layer 36 is formed on the reset drain region 20. That is, a structure except the silicide layer 36 is common in the unit cells in accordance with the first and second embodiments. Parts or elements that correspond to those of the unit cell illustrated in FIG. 2 have been provided with the same reference numerals in the unit cell illustrated in FIG. 4.

The formation of the silicide layer 36 on the reset drain region 20 makes it possible to reduce a contact resistance.

A method of fabricating the unit cell illustrated in FIG. 4 is explained hereinbelow with reference to FIGS. 5A and 5B.

The method is basically the same as the method of fabricating the unit cell illustrated in FIG. 2, but is different only in the formation of the silicon dioxide film 34.

The steps having been explained with reference to FIGS. 3A to 3D are carried out in the same manner as the first embodiment.

Figure 5A:
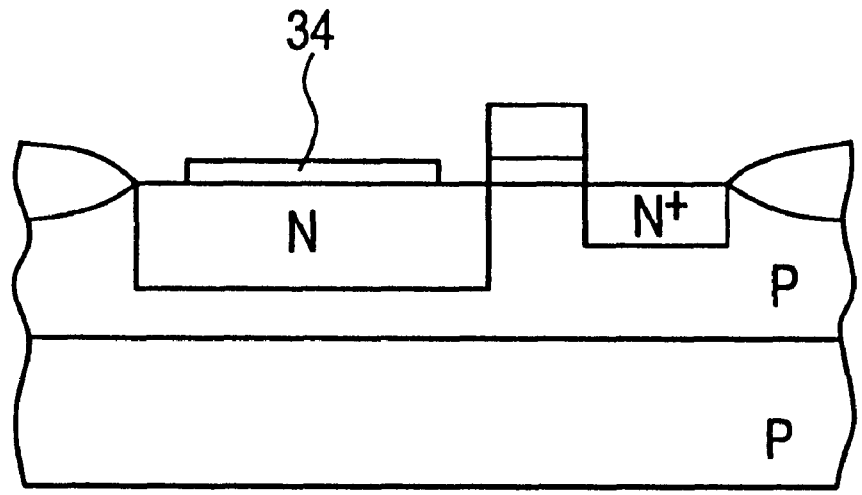
FIGS. 5A and 5B are cross-sectional views of a unit cell, illustrating some of steps of a method of fabricating the unit cell illustrated in FIG. 4.

Then, as illustrated in FIG. 5A, the silicon dioxide film 34 is partially removed in an area where the light-electricity converting region 14 is to be silicified at a surface and an area on the reset drain region 20. That is, the silicon dioxide film 34 is removed at a boarder of the light-electricity converting region 14, and on the reset drain region 20.

Figure 5B:
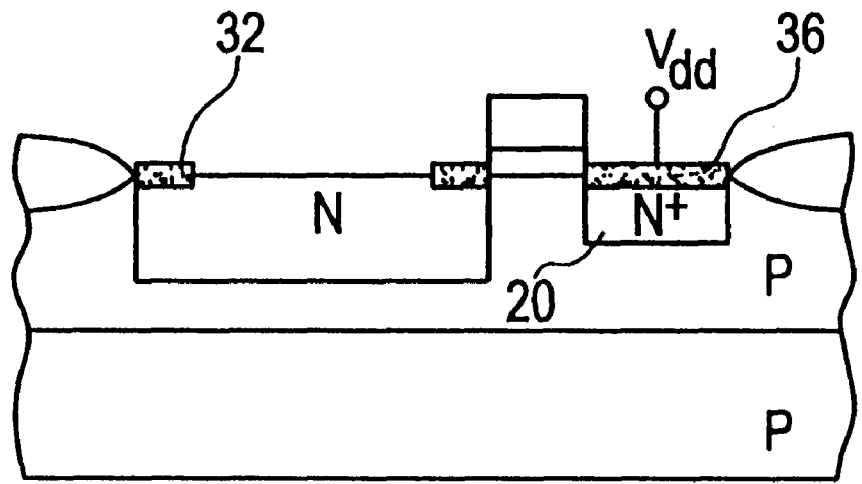

Then, as illustrated in FIG. 5B, titanium (Ti) is deposited by sputtering by a thickness of about 40 nm on the light-electricity converting region 14 at a region where the silicon dioxide film 34 was removed, and on the reset drain region 20. Thereafter, titanium is heated at 700 degrees centigrade for a minute to thereby form both a silicide region 32 at a boarder of the light-electricity converting region 14 and a silicide layer 36 on the reset drain region 20.

Then, the silicon dioxide film 34 is entirely removed. A portion of the silicon dioxide film 34, situated below the reset gate 18, makes the gate insulating film 16.

Then, there are formed an interlayer insulating film, a wiring layer, a light-impermeable film, and so on. Thus, there is completed the unit cell illustrated in FIG. 4.

In the first and second embodiments, a gate of the second MOS transistor 28 in the source follower amplifier 24 is electrically connected to the light-electricity converting region 14. As an alternative, the gate may be electrically connected to the silicide region 32 in place of the light-electricity converting region 14.

In the first and second embodiments, the solid-state image sensor in accordance with the present invention is applied to a CMOS sensor. However, those skilled in the art would readily understand that the solid-state image sensor in accordance with the present invention may be applied to a CCD sensor While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-241322 filed on Aug. 27, 1998 including specification, claims, drawings and summary is incorporated herein by reference in its entirety.

What is claimed is:

1. A method of fabricating a solid-state image sensor, comprising the steps of:
    (a) forming a first region in which light is converted into electricity, in a silicon substrate, said first region having an electrical conductivity opposite to an electrical conductivity of said silicon substrate; and
    (b) forming a second region composed of silicide, said second region forming a border area of said first region at a surface of said first region.

2. The method as set forth in claim 1, wherein said step (b) is carried out by silicifying a border area of said first region.

3. The method as set forth in claim 1, wherein said step (b) is carried out by depositing a refractory metal film and heating said refractory metal film.

4. The method as set forth in claim 1, further comprising the step of forming a light-impermeable film having an opening situated above said first region.

5. A method of fabricating a solid-state image sensor, comprising the steps of:
    (a) forming a first region in which light is converted into electricity, in a silicon substrate, said first region having an electrical conductivity opposite to an electrical conductivity of said silicon substrate;
    (b) forming a reset gate on said silicon substrate;
    (c) forming a reset drain region in said silicon substrate, said reset drain region having an electrical conductivity opposite to an electrical conductivity of said silicon substrate; and
    (d) forming a second region composed of suicide, said second region forming a border area of said first region at a surface of said first region.

6. A method as set forth in claim 5, wherein said step (d) is carried out by silicifying a border area of said region.

7. The method as set forth in claim 5, wherein said step (d) is carried out by depositing a refractory metal film and heating said refractory metal film.

8. The method as set forth in claim 5, further comprising the step of forming a light-impermeable film having an opening situated above said first region.

9. The method as set forth in claim 5, further comprising the step of forming a third region on a surface of said reset drain region, said third region being composed of silicide.

10. The method as set forth in claim 9, wherein said second and third regions are simultaneously formed.

11. A method of fabricating a solid-state image sensor, comprising the steps of:
    (a) forming a well in a silicon substrate;
    (b) forming a first region in which light is converted into electricity, in said well, said first region having an electrical conductivity opposite to an electrical conductivity of said well;
    (c) forming a reset gate on said well;
    (d) forming a reset drain region in said well, said reset drain region having an electrical conductivity opposite to an electrical conductivity of said well; and
    (e) forming a second region composed of silicide, said second region forming a border area of said first region at a surface of said first region.

12. The method as set forth in claim 11, wherein said step (e) is carried out by silicifying a border area of said first region.

13. The method as set forth in claim 11, wherein said step (e) is carried out by depositing a refractory metal film and heating said refractory metal film.

14. The method as set forth in claim 11, further comprising the step of forming a light-impermeable film having an opening situated above said first region.

15. The method as set forth in claim 11, further comprising the step of forming a third region on a surface of said reset drain region, said third region being composed of silicide.

16. The method as set forth in claim 11, where in said second and third regions are simultaneously formed.

* * * * *